(12) United States Patent
Yu et al.

(10) Patent No.: US 9,641,139 B2
(45) Date of Patent: May 2, 2017

(54) AMPLIFIER AND RELATED METHOD

(71) Applicant: MEDIATEK INC., Hsin-Chu (TW)

(72) Inventors: Chi-Yao Yu, Hsinchu County (TW); Chung-Yun Chou, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/922,208

(22) Filed: Oct. 26, 2015

(65) Prior Publication Data
US 2016/0142027 A1 May 19, 2016

Related U.S. Application Data

(60) Provisional application No. 62/080,933, filed on Nov. 17, 2014.

(51) Int. Cl.
*H04B 1/06* (2006.01)
*H03F 3/68* (2006.01)
(Continued)

(52) U.S. Cl.
CPC ........... *H03F 3/193* (2013.01); *H03F 1/0277* (2013.01); *H03F 1/223* (2013.01); *H03F 3/211* (2013.01); *H03F 3/68* (2013.01); *H03F 3/72* (2013.01); *H04B 1/04* (2013.01); *H03F 2200/111* (2013.01); *H03F 2200/129* (2013.01); *H03F 2200/144* (2013.01); *H03F 2200/294* (2013.01); *H03F 2200/451* (2013.01); *H03F 2200/54* (2013.01); *H03F 2200/75* (2013.01); *H03F 2200/87* (2013.01); *H03F 2203/21142* (2013.01); *H03F 2203/21154* (2013.01); *H03F 2203/21175* (2013.01);
(Continued)

(58) Field of Classification Search
CPC ... H04B 1/04; H04B 1/16; H04B 1/40; H04B 1/0067; H04B 2001/0416
USPC ......... 455/232.1, 234.1, 253.2, 552.1, 553.1; 330/295, 310
See application file for complete search history.

(56) References Cited

U.S. PATENT DOCUMENTS 7,486,135 B2  2/2009  Mu
7,650,132 B2  1/2010  Darabi
(Continued)

OTHER PUBLICATIONS

Beffa, A Receiver for WCDMA/EDGE Mobile Phones with Inductorless Front-End in 65nm CMOS, pp. 370-371 and a page including Figure 21.4.7, ISSCC 2011/Session 21/Cellular/21.4.

*Primary Examiner* — Quochien B Vuong
(74) *Attorney, Agent, or Firm* — Winston Hsu; Scott Margo

(57) ABSTRACT

An amplifier applicable to an intra-band non-contiguous carrier aggregation (NCCA) band includes a first amplifier circuit and a second amplifier circuit. The NCCA band includes at least a primary component carrier (PCC) channel and a secondary component carrier (SCC) channel not adjacent to each other. The first amplifier circuit receives a first input signal, and generates a first output signal for undergoing down-conversion of one of the PCC channel and the SCC channel. The second amplifier circuit receives at least one second input signal, and generates a second output signal for undergoing down-conversion of another of the PCC channel and the SCC channel. The at least one second input signal received by the second amplifier circuit is provided by the first amplifier circuit according to the first input signal.

38 Claims, 10 Drawing Sheets

(51) Int. Cl.
*H03F 3/193* (2006.01)
*H03F 1/02* (2006.01)
*H03F 1/22* (2006.01)
*H03F 3/21* (2006.01)
*H03F 3/72* (2006.01)
*H04B 1/04* (2006.01)

(52) U.S. Cl.
CPC ............... *H03F 2203/7206* (2013.01); *H03F 2203/7236* (2013.01); *H04B 2001/0416* (2013.01)

(56) References Cited

U.S. PATENT DOCUMENTS

| | | | |
|---|---|---|---|
| 8,412,139 B2 * | 4/2013 | Park | H04L 27/2647 455/553.1 |
| 8,698,560 B2 | 4/2014 | Li | |
| 8,903,343 B2 * | 12/2014 | Holenstein | H04B 1/16 455/234.1 |
| 8,975,968 B2 * | 3/2015 | Abdelhalem | H03F 1/22 330/311 |
| 9,338,668 B2 * | 5/2016 | Motamed | H04L 5/001 |
| 9,362,975 B2 * | 6/2016 | Wu | H03F 3/193 |
| 2010/0182090 A1 | 7/2010 | Yang | |
| 2010/0237945 A1 | 9/2010 | Cassia | |
| 2013/0315348 A1 | 11/2013 | Tasic | |
| 2014/0210554 A1 | 7/2014 | Abdelhalem | |
| 2014/0213209 A1 | 7/2014 | Holenstein | |
| 2014/0253242 A1 | 9/2014 | Youssef | |

* cited by examiner

AMPLIFIER AND RELATED METHOD

CROSS REFERENCE TO RELATED APPLICATIONS

This application claims the benefit of U.S. provisional application No. 62/080,933, filed on Nov. 17, 2014 and incorporated herein by reference.

BACKGROUND

Carrier aggregations (CAs) refer to simultaneous wireless reception of several signal channels corresponding to different frequencies in a Long Term Evolution (LTE) wireless system.

FIGS. 1-3 illustrate different carrier aggregation schemes, respectively. The intra-band continuous/non-contiguous carrier aggregation occurs when multiple component carriers locate in a same radio frequency (RF) band, as shown in FIGS. 1 and 2. The inter-band carrier aggregation occurs when multiple available component carriers locate in different RF bands, as shown in FIG. 3.

As illustrated in the intra-band contiguous carrier aggregation 100 of FIG. 1, the signal channels 102a, 102b locate in Band A and are adjacent to each other. The higher-frequency component carrier 102b may be viewed as a primary component carrier (PCC), and the lower-frequency component carrier 102a may be viewed as the secondary component carrier (SCC).

FIG. 2 illustrates an example of intra-band non-contiguous carrier aggregation 200, wherein the component carriers 202a, 202b are both in Band A but are not adjacent to each other. The higher-frequency component carrier 202b may be viewed as the PCC, and the lower-frequency component carrier 202a may be viewed as the SCC.

FIG. 3 illustrates an example of inter-band non-contiguous carrier aggregation 300, wherein the component carriers 302a and 302b are in Band A and Band B, respectively. The component carrier 302a may be the PCC and the component carrier 302b may be the SCC. In the inter-band carrier aggregation shown in FIG. 3, the two signal channels are in different reception bands.

In FIG. 2, there is only one receiving band (Band A) and two non-contiguous channels. Thus, there is a need for an innovative low-noise amplifier (LNA) design which is capable of receiving one RF input and generating two RF outputs to different mixers for down-conversion of two channels, including one PCC channel and one SCC channel. Further, since the required signal levels of the two channels, including one PCC channel and one SCC channel, may not be equal to each other, there is also a need for enabling an LNA design to support a function of using different gains for generating output signals to different mixers for down conversion.

SUMMARY

In view of the above, one objective of the present invention is to provide an amplifier and a related method for processing two non-contiguous channels in the same band, such as one PCC channel and one SCC channel transmitted using an intra-band non-contiguous carrier aggregation scheme.

According to a first aspect of the present invention, an exemplary amplifier applicable to an intra-band non-contiguous carrier aggregation (NCCA) band is provided. The NCCA band includes at least a primary component carrier (PCC) channel and a secondary component carrier (SCC) channel not adjacent to each other. The exemplary amplifier includes a first amplifier circuit and a second amplifier circuit. The first amplifier circuit is arranged to receive a first input signal and generate a first output signal for undergoing down-conversion of one of the PCC channel and the SCC channel. The second amplifier circuit is arranged to receive at least one second input signal and generate a second output signal for undergoing down-conversion of another of the PCC channel and the SCC channel. The at least one second input signal received by the second amplifier circuit is provided by the first amplifier circuit according to the first input signal.

According to a second aspect of the present invention, an exemplary method for operating an amplifier applicable to an intra-band non-contiguous carrier aggregation (NCCA) band is provided. The NCCA band includes at least a primary component carrier (PCC) channel and a secondary component carrier (SCC) channel not adjacent to each other. The exemplary method includes: utilizing a first amplifier circuit to receive a first input signal and generate a first output signal for undergoing down-conversion of one of the PCC channel and the SCC channel; providing at least one second input signal to a second amplifier circuit; and utilizing the second amplifier circuit to receive the at least one second input signal and to generate a second output signal for undergoing down-conversion of another of the PCC channel and the SCC channel. The at least one second input signal received by the second amplifier circuit is provided by the first amplifier circuit according to the first input signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should not be interpreted as a close-ended term such as "consist of". Also, the term "couple" is intended to mean either an indirect or direct electrical connection. Accordingly, if one device is coupled to another device, that connection may be through a direct electrical connection, or through an indirect electrical connection via other devices and connections.

Figure 1:
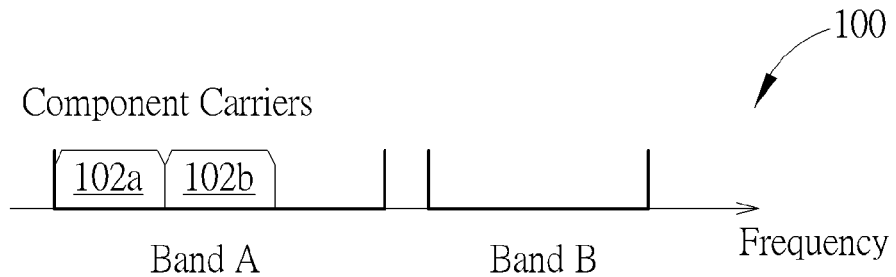
FIG. 1 is a diagram illustrating an example of a first conventional carrier aggregation scheme.
Figure 2:
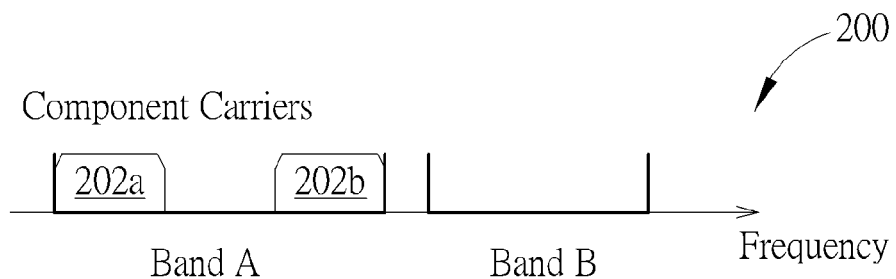
FIG. 2 is a diagram illustrating an example of a second conventional carrier aggregation scheme.
Figure 3:
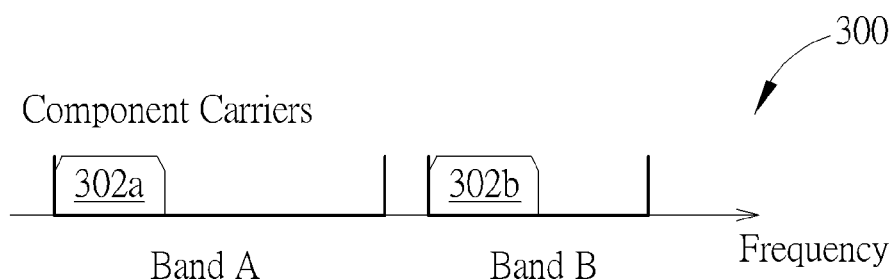
FIG. 3 is a diagram illustrating an example of a third conventional carrier aggregation scheme.
Figure 4:
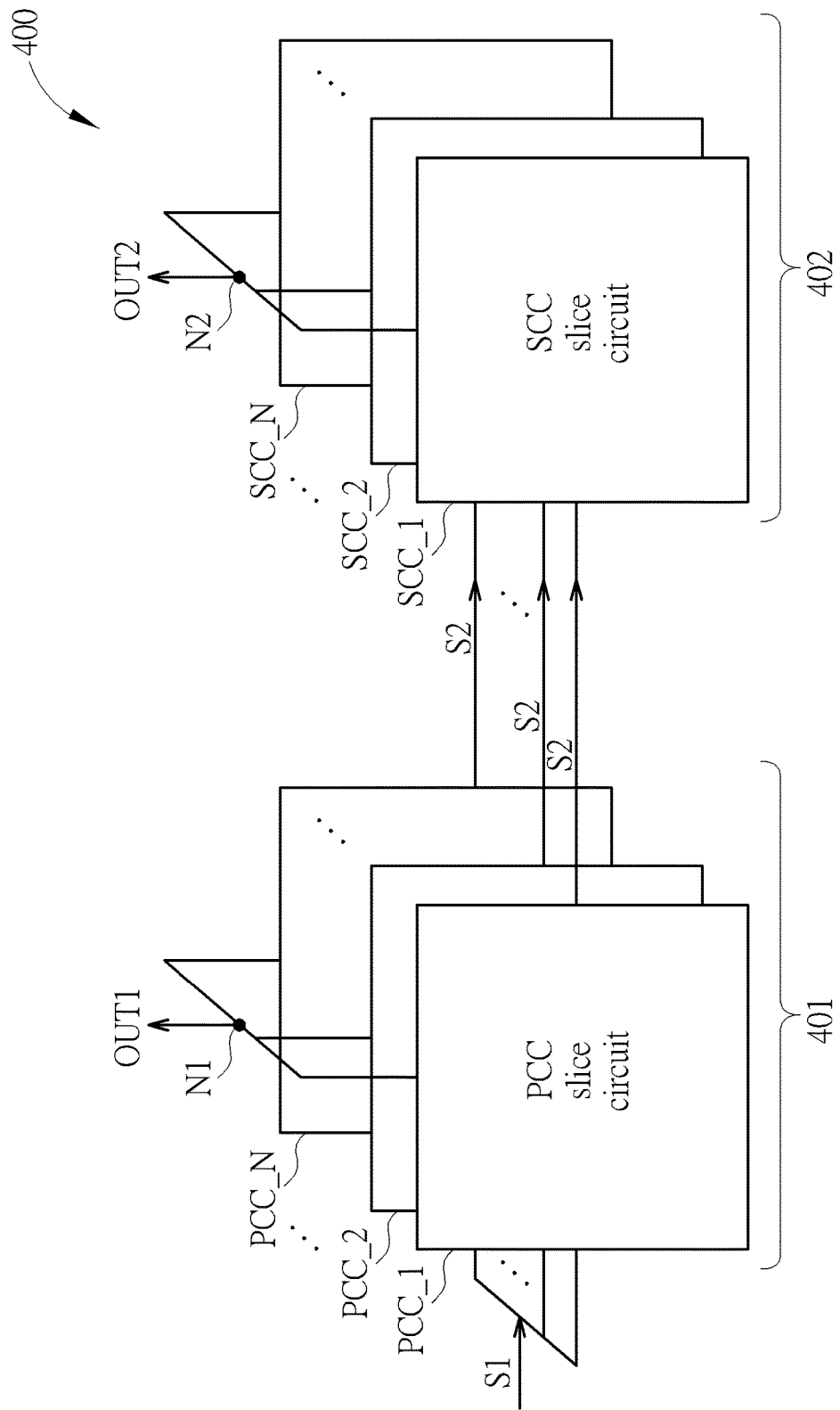
FIG. 4 is a diagram illustrating an amplifier according to an embodiment of the present invention.

FIG. 4 is a diagram illustrating an amplifier 400 according to an embodiment of the present invention. In one embodiment, the amplifier 400 is applied to an NCCA band (e.g. the NCCA band shown in FIG. 2). In one embodiment, the amplifier 400 is a low noise amplifier (LNA) with multiple outputs. As shown in FIG. 4, the amplifier 400 includes a first amplifier circuit (e.g., first LNA circuit) 401 and a second amplifier circuit (e.g., second LNA circuit) 402. The first amplifier circuit 401 includes a plurality of first slice circuits (e.g., PCC slice circuits PCC_1-PCC_N), and the second amplifier circuit 402 includes a plurality of second slice circuits (e.g., SCC slice circuits SCC_1-SCC_N), where the plurality of PCC slice circuits PCC_1-PCC_N correspond to the plurality of SCC slice circuits SCC_1-SCC_N, respectively. In one embodiment, the PCC slice circuits PCC_1-PCC_N are coupled to the SCC slice circuits SCC_1-SCC_N, respectively. Hence, an input signal of an SCC slice circuit is provided by a corresponding PCC slice circuit.

In this example, the first amplifier circuit 401 is arranged to receive a first input signal S1 and generate a first output signal OUT1 for undergoing down-conversion of the PCC channel at one mixer (not shown), and the second amplifier circuit 402 is arranged to receive at least one second input signal S2 and generate a second output signal OUT2 for undergoing down-conversion of the SCC channel at another mixer (not shown), where the at least one second input signal S2 received by the second amplifier circuit 402 is provided by the first amplifier circuit 401 according to the first input signal S1. The first input signal S1 is received from an NCCA band. Since each of the first output signal OUT1 and the second output signal OUT2 is derived from amplifying an input signal directly/indirectly set by the first input signal S1, each of the first output signal OUT1 and the second output signal OUT2 include PCC channel components and SCC channel components.

When a PCC slice circuit is turned on, the PCC slice circuit receives the first input signal S1, and amplifies the first input signal S1 to generate an amplified output to an output port N1 of the first amplifier circuit 401. Hence, amplified outputs generated from turned-on PCC slice circuits are combined at the output port N1 of the first amplifier circuit 401 to form the first output signal OUT1 having PCC channel components and SCC channel components. Moreover, the first amplifier circuit 401 is arranged to generate the first output signal OUT1 according to a first gain (e.g., PCC gain), where the first gain is adjusted according to the number of turned-on PCC slice circuits of the first amplifier circuit 401. As mentioned above, the first output signal OUT1 will undergo down-conversion of the PCC channel. Hence, the first amplifier circuit 401 with the first gain properly adjusted can ensure that PCC channel components in the first output signal OUT1 have proper magnitude, such that a down-conversion result of the PCC channel will have desired signal magnitude.

Similarly, when an SCC slice circuit is turned on, the SCC slice circuit receives a second input signal S2 from a corresponding PCC slice circuit, and amplifies the received second input signal S2 to generate an amplified output to an output port N2 of the second amplifier circuit 402. Hence, amplified outputs generated from turned-on SCC slice circuits are combined at the output port N2 of the second amplifier circuit 402 to form the second output signal OUT2 having PCC channel components and SCC channel components. Moreover, the second amplifier circuit 402 is arranged to generate the second output signal OUT2 according to a second gain (e.g., SCC gain), where the second gain is adjusted according to the number of turned-on SCC slice circuits of the second amplifier circuit 402. As mentioned above, the second output signal OUT2 will undergo down-conversion of the SCC channel. Hence, the second amplifier circuit 402 with the second gain properly adjusted can ensure that SCC channel components in the second output signal OUT1 have proper magnitude, such that a down-conversion result of the SCC channel will have desired signal magnitude.

In one exemplary design, the PCC slice circuits PCC_1-PCC_N may include low-gain slice circuits and high-gain slice circuits, and the SCC slice circuits SCC_1-SCC_N may include low-gain slice circuits and high-gain slice circuits. For example, the PCC slice circuit PCC_N and the SCC slice circuit SCC_N shown in FIG. 4 may be low-gain slice circuits, and the PCC slice circuits PCC_1-PCC_2 and the SCC slice circuits SCC_1-SCC_2 shown in FIG. 4 may be high-gain slice circuits. The high-gain slice circuit and the low-gain slice circuit have different amplifier structures with different gain settings. Byway of example, but not limitation, the high-gain slice circuit may employ a shunt-shunt feedback LNA structure. Alternatively, all of the PCC slice circuits PCC_1-PCC_N may be high-gain slice circuits, and all of the SCC slice circuits SCC_1-SCC_N may be high-gain slice circuits.

Figure 5:
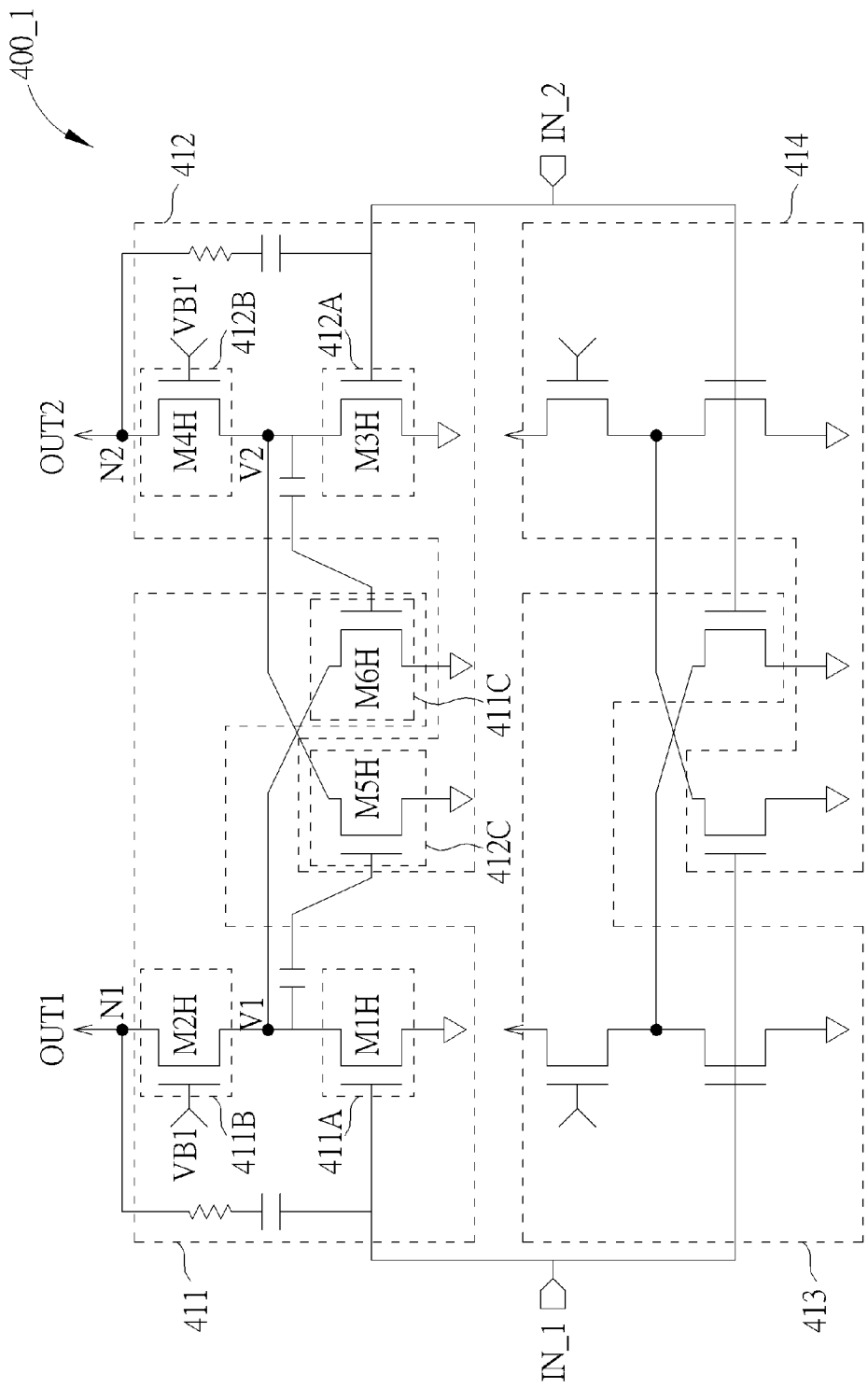
FIG. 5 is a diagram illustrating a partial circuit structure of the amplifier shown in FIG. 4 according to an embodiment of the present invention.

FIG. 5 is a diagram illustrating a partial circuit structure 400_1 of the amplifier 400 shown in FIG. 4 according to an embodiment of the present invention. For example, only four slice circuits are shown in FIG. 5 for illustrative purposes. The partial circuit structure 400_1 includes two PCC slice circuits 411 and 413 and two SCC slice circuits 412 and 414. In this example, the PCC slice circuit 411 and the SCC slice circuit 412 may be high-gain slice circuits for a high-gain path/high-gain mode, and the PCC slice circuit 413 and the SCC slice circuit 414 may be low-gain slice circuits for a low-gain path/low-gain mode. The high-gain path and the low-gain path may be selected/switched according to design requirements. For example, one of a high-gain mode and a low-gain mode may be selected to match a current operation requirement. When the low-gain mode is selected, smaller current consumption may be achieved through using low-gain slice circuit(s) only. However, this is for illustrative purposes only, and is not meant to be a limitation of the present invention. Alternatively, the low-gain slice circuits, such as the PCC slice circuit 413 and the SCC slice circuit 414 shown in FIG. 4, may be omitted.

The PCC slice circuit 411 includes an output buffer 411B, one input stage 411A and another input stage 411C. The SCC slice circuit 412 includes an output buffer 412B, one input stage 412A and another input stage 412C. By way of example, rather than limitation, the input stage 411A may include a transistor M1H, the output buffer 411B may include a transistor M2H, the input stage 411C may include a transistor M6H, the input stage 412A may include a transistor M3H, the output buffer 412B may include a transistor M4H, and the input stage 412C may include a transistor M5H. In one example, all of the transistors M1H-M6H may be N-channel metal-oxide-semiconductor transistors (NMOS transistors).

In one embodiment, the first amplifier circuit 401 and the second amplifier circuit 402 can be arranged in a symmetric configuration. Hence, the same amplifier circuitry can be shared for performing the NCCA receiving operation in different bands. For example, when a mobile phone using the amplifier 400 is operated in a first region/country, an NCCA band in use may be a first band. A radio frequency (RF) signal (e.g., IN_1) may be received from a first receive (RX) port and fed into the amplifier 400. For another example, when the mobile phone using the amplifier 400 is operated in a second region/country, an NCCA band in use may be a second band different from the first band. An RF signal (e.g., IN_2) may be received from a second RX port and fed into the amplifier 400. For clarity and simplicity, the following assumes that the RF signal (e.g., IN_1) of a desired NCCA band is received from the first RX port and fed into the amplifier 400, while no RF signal (e.g., IN_2) is received from the second RX port. Since a person skilled in the art can readily understand details of processing an RF signal (e.g., IN_2) of a desired NCCA band received from the second RX port and fed into the amplifier 400 after reading following paragraphs directed to an example of processing an RF signal (e.g., IN_1) of a desired NCCA band received from the first RX port and fed into the amplifier 400, related description is omitted.

With regard to the PCC slice circuit 411, a control node of the transistor M1H (e.g., gate of NMOS transistor) is arranged to receive one RF signal, a first connection node of the transistor M1H (e.g., drain of NMOS transistor) is coupled to the transistor M2H, and a second connection node of the transistor M1H (e.g., source of NMOS transistor) is coupled to one reference voltage (e.g., ground voltage). The transistors M1H and M2H are arranged in a cascade fashion. With regard to the transistor M2H, a control node (e.g., gate of NMOS transistor) is arranged to receive a first bias voltage VB1, a first control node (e.g., drain of NMOS transistor) is coupled to the output port N1 of the first amplifier circuit 401, and a second connection node (e.g., source of NMOS transistor) is coupled to the first connection node of the transistor M1H. The first bias voltage VB1 is used to control whether the PCC slice circuit 411 is turned on to have contribution to the first output signal OUT1. When the first bias voltage VB1 has a low level, the transistor M2H is turned off, thus blocking the PCC slice circuit 411 from generating an amplified output that will be at least a portion of the first output signal OUT1. When the first bias voltage VB1 has a high level, the transistor M2H is turned on, thus allowing the PCC slice circuit 411 to generate an amplified output that will be at least a portion of the first output signal OUT1.

With regard to the SCC slice circuit 412, a control node of the transistor M3H (e.g., gate of NMOS transistor) is arranged to receive another RF signal, a first connection node of the transistor M3H (e.g., drain of NMOS transistor) is coupled to the transistor M4H, and a second connection node of the transistor M3H (e.g., source of NMOS transistor) is coupled to the reference voltage (e.g., ground voltage). The transistors M3H and M4H are arranged in a cascade fashion. With regard to the transistor M4H, a control node (e.g., gate of NMOS transistor) is arranged to receive another first bias voltage VB1', a first control node (e.g., drain of NMOS transistor) is coupled to the output port N2 of the second amplifier circuit 402, and a second connection node (e.g., source of NMOS transistor) is coupled to the first connection node of the transistor M3H. The first bias voltage VB1' is used to control whether the SCC slice circuit 412 is turned on to have contribution to the second output signal OUT2. When the second bias voltage VB2 has a low level, the transistor M4H is turned off, thus blocking the SCC slice circuit 412 from generating an amplified output that will be at least a portion of the second output signal OUT2. When the second bias voltage VB2 has a high level, the transistor M4H is turned on, thus allowing the SCC slice circuit 412 to generate an amplified output that will be at least a portion of the second output signal OUT2.

Consider a case where the RF signal (e.g., IN_1) of a desired NCCA band is received from the first RX port and fed into the amplifier 400, while no RF signal (e.g., IN_2) is received from the second RX port. As shown in FIG. 5, a control node of the transistor M5H (e.g., gate of NMOS transistor) is coupled to the first connection node of the transistor M1H, a first connection node of the transistor M5H (e.g., drain of NMOS transistor) is coupled to the first connection node of the transistor M3H, and a second connection node of the transistor M5H (e.g., source of NMOS transistor) is coupled to the reference voltage (e.g., ground voltage). Since the SCC (e.g. the component carrier 202a mentioned in FIG. 2) is located in the same band as PCC in the NCCA scenario in which the PCC slice circuit 411 is turned on by one first bias voltage VB1 and the SCC slice circuit 412 is also turned on by another first bias voltage VB1', it is a part of the first input signal IN_1 and also received through the PCC slice circuit 411 of the first amplifier circuit 401. Therefore, in addition to the PCC signal, the SCC signal is also amplified by the input stage 411A of the PCC slice circuit 411. Moreover, an inter-stage signal V1 is generated by the input stage 411A before the amplified output of the PCC slice circuit 411 is output to the output port N1 of the first amplifier circuit 401. Though the input stage 412A of the SCC slice circuit 412 is turned off, the input stage 412C of the SCC slice circuit 412 is arranged to sense/receive the inter-stage signal V1 as a second input signal, and amplify the second input signal (which is derived from the inter-stage signal V1) to generate a signal V2 to the output buffer 412B of the SCC slice circuit 412. It should be noted that the input stage 411C is turned off in this case. Finally, the output buffer 412B generates an amplified output to the output port N2 of the second amplifier circuit 402 according to the signal V2 derived from the inter-stage signal V1 via the input stage 412C. It should be noted that each of the first output signal OUT1 and the second output signal OUT2 has the PCC channel data and the SCC channel data. Hence, one mixer with a local oscillator frequency properly set to the PCC can perform down-conversion to extract the PCC channel data from the first output signal OUT1, and another mixer with a local oscillator frequency properly set to the SCC can perform down-conversion to extract the SCC channel data from the second output signal OUT2.

With regard to the low-gain path in the NCCA scenario, a signal is sensed from an input node of the PCC slice circuit 413 directly and then fed to a cascade node inside the SCC slice circuit 414 through an input stage when the RF signal (e.g., IN_1) of a desired NCCA band is received from the first RX port. As low-gain slice circuits can be optional and the present invention focuses on the high-gain slice circuits, further description of the low-gain slice circuits is omitted for brevity.

As mentioned above, the first gain of the first amplifier circuit 401 is controlled by the number of turned-on PCC slice circuits, and the second gain of the second amplifier circuit 402 is controlled by the number of turned-on SCC slice circuits. Considering the high-gain path in the NCCA scenario, if the first gain of the first amplifier circuit 401 used to generate the first output signal OUT1 for undergoing down-conversion of the PCC channel is required to be equal to the second gain of the second amplifier circuit 402 used to generate the second output signal OUT2 for undergoing down-conversion of the SCC channel, the number of turned-on PCC slice circuits in the first amplifier circuit 401 is equal to the number of turned-on SCC slice circuits in the second amplifier circuit 402. Hence, both of the PCC slice circuit 411 and the SCC slice circuit 412 are turned on, such that the inter-stage signal V1 can be created in the PCC slice circuit 411 and sensed by the SCC slice circuit 412. However, if the first gain of the first amplifier circuit 401 used to generate the first output signal OUT1 for undergoing down-conversion of the PCC channel is required to be smaller than the second gain of the second amplifier circuit 402 used to generate the second output signal OUT2 for undergoing down-conversion of the SCC channel, the number of turned-on PCC slice circuits in the first amplifier circuit 401 is smaller than the number of turned-on SCC slice circuits in the second amplifier circuit 402. Hence, it is possible that the PCC slice circuit 411 should be turned off, and the SCC slice circuit 412 should be turned on. In this case, there is an issue that the SCC slice circuit 412 is unable to generate the second output signal OUT2 due to the turned-off PCC slice circuit 411. This phenomenon is illustrated in FIG. 6.

Figure 6:
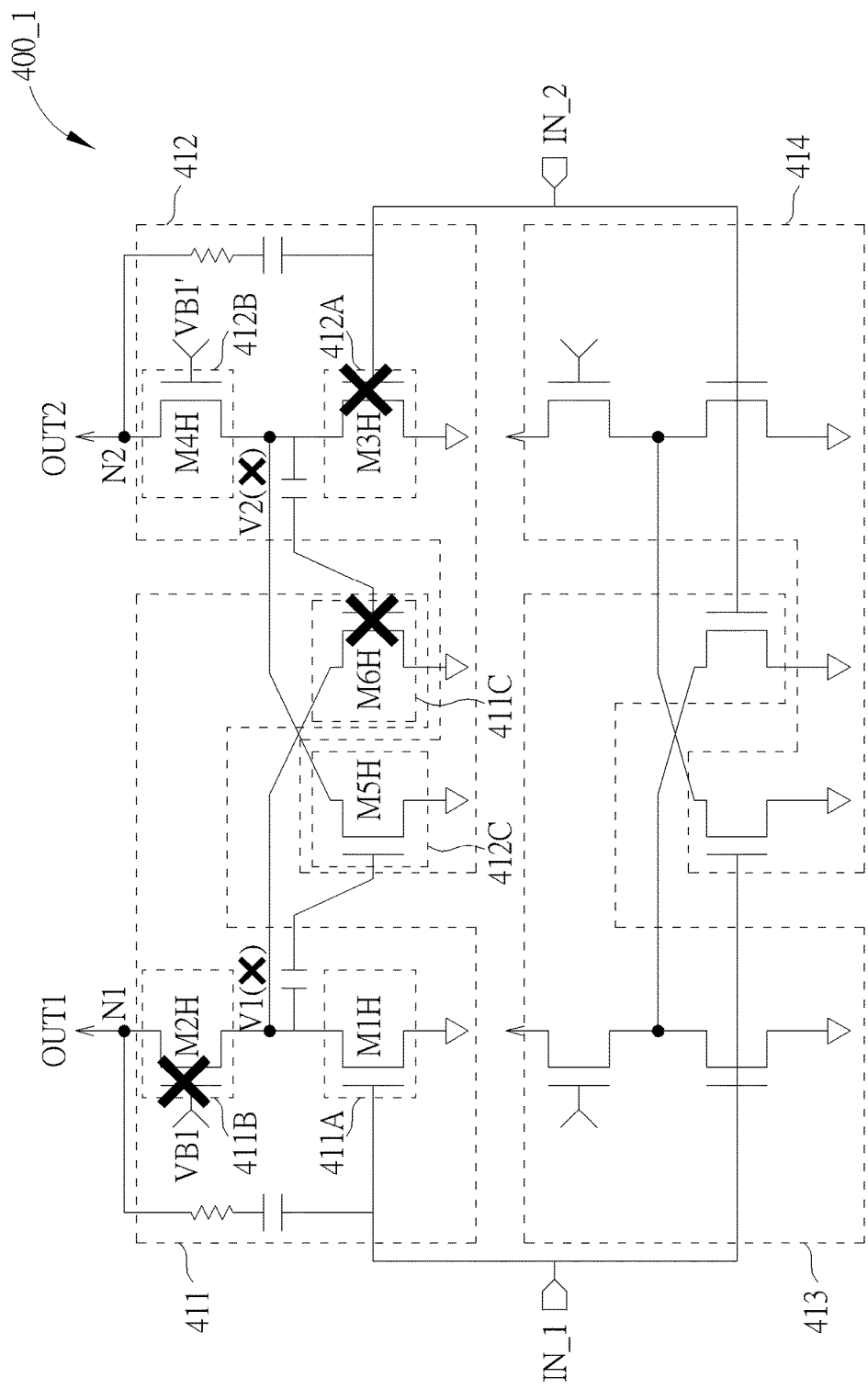
FIG. 6 is a diagram illustrating a case where a gain setting of a first amplifier circuit is smaller than a gain setting of a second amplifier circuit.

FIG. 6 is a diagram illustrating a case where the first gain of the first amplifier circuit 401 is smaller than the second gain of the second amplifier circuit 402. In this example, one first bias voltage VB1 is set by a low level for turning off the PCC slice circuit 411 (particularly, the output buffer 411B coupled to the output port N1), and another first bias voltage VB1' is set by a high level for turning on the SCC slice circuit 412 (particularly, the output buffer 412B coupled to the output port N2). Since the first bias voltage VB1 is a low level to the gate of the transistor M2H of the output buffer 411B, the transistor M2H is turned off. Since the current path of the cascoded transistors M1H and M2H is cut off due to the turned-off transistor M2H, no inter-stage signal V1 is created at the cascade node in the PCC slice circuit 411. As a result, no inter-stage signal V1 can be sensed by the input stage 412C to generate the signal V2 at the cascade node between the transistors M3H and M4H. Hence, the SCC slice circuit 412 is unable to generate an amplified output to the output port N2 of the second amplifier circuit 402 due to absence of a second input signal provided by the PCC slice circuit 411. It should be noted that, in addition to the transistor M2H, the transistors M3H and M6H are also turned off in this case.

Figure 7:
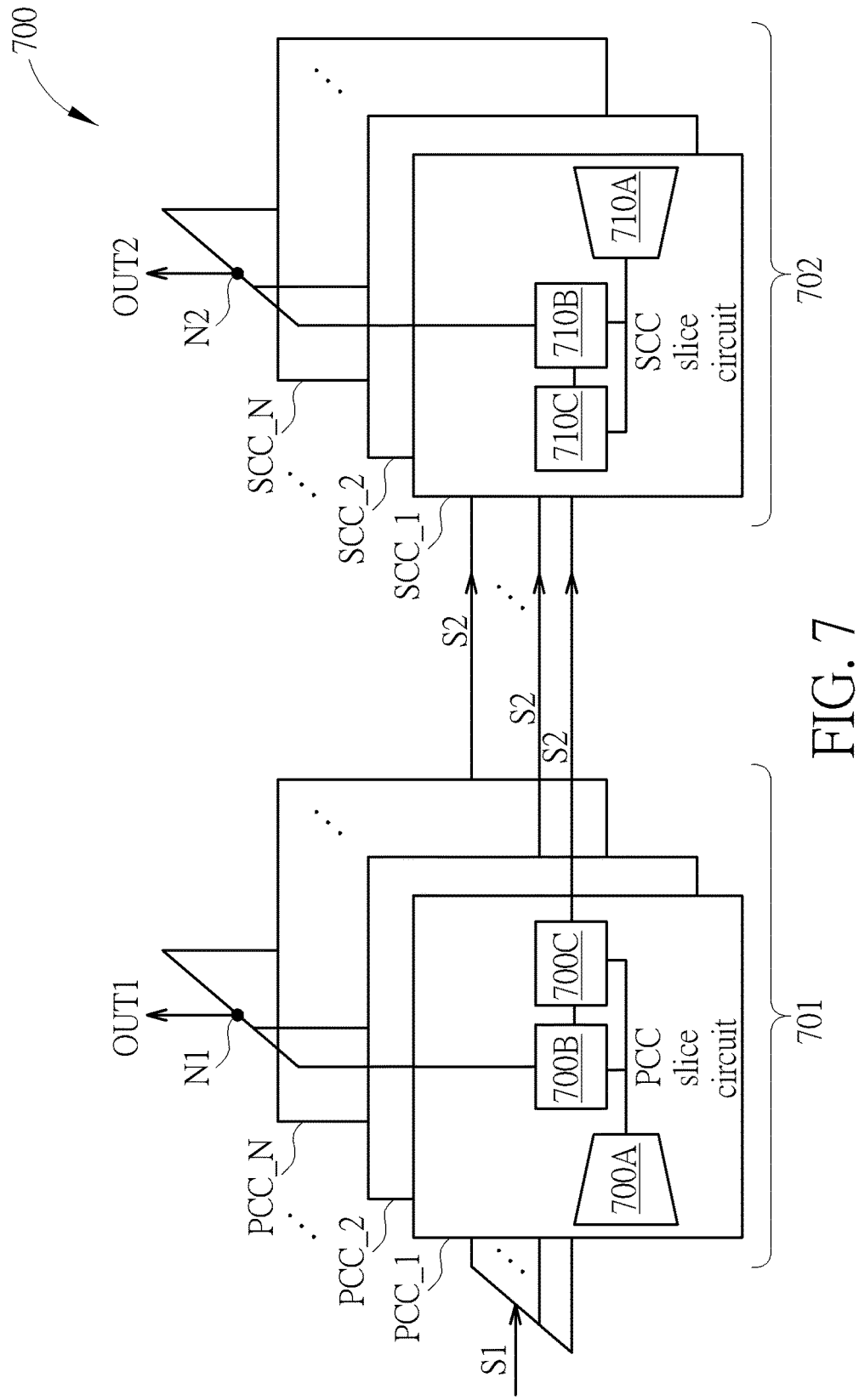
FIG. 7 is a diagram illustrating an amplifier according to another embodiment of the present invention.

To solve the above issue encountered in the case shown in FIG. 6, a solution is provided in FIG. 7. FIG. 7 is a diagram illustrating an amplifier 700 according to another embodiment of the present invention. In one embodiment, the amplifier 700 is applied to an NCCA band (e.g. the NCCA band shown in FIG. 2). In one embodiment, the amplifier 700 is a low noise amplifier (LNA) with multiple outputs. As shown in FIG. 7, the amplifier 700 includes a first amplifier circuit (e.g., first LNA circuit) 701 and a second amplifier circuit (e.g., second LNA circuit) 702. Like the first amplifier circuit 401, the first amplifier circuit 701 includes a plurality of first slice circuits (e.g., PCC slice circuits PCC_1-PCC_N). Like the second amplifier circuit 402, the second amplifier circuit 702 includes a plurality of second slice circuits (e.g., SCC slice circuits SCC_1-SCC_N), where the plurality of PCC slices PCC_1-PCC_N correspond to the plurality of SCC slices SCC_1-SCC_N, respectively. In one embodiment, the PCC slice circuits PCC_1-PCC_N are coupled to the SCC slice circuits SCC_1-SCC_N, respectively. Hence, an input signal of an SCC slice circuit is provided by a corresponding PCC slice circuit.

The first amplifier circuit 701 is used to generate a first output signal OUT1 at an output port N1 for undergoing down-conversion of the PCC channel at one mixer (not shown), and the second amplifier circuit 702 is used to generate a second output signal OUT2 at an output port N2 for undergoing down-conversion of the SCC channel at another mixer (not shown). In one exemplary design, the PCC slice circuits PCC_1-PCC_N of the first amplifier circuit 701 may include low-gain slice circuits and high-gain slice circuits, and the SCC slice circuits SCC_1-SCC_N of the second amplifier circuit 702 may include low-gain slice circuits and high-gain slice circuits. In another exemplary design, the PCC slice circuits PCC_1-PCC_N of the first amplifier circuit 701 may include high-gain slice circuits only, and the SCC slice circuits SCC_1-SCC_N of the second amplifier circuit 702 may include high-gain slice circuits. As shown in FIG. 7, the PCC slice circuit PCC_1 and the SCC slice circuit SCC_1 are high-gain slice circuit. By way of example, but not limitation, the high-gain slice circuit may employ a shunt-shunt feedback LNA structure.

The slice-based structure and associated gain control operation of the amplifier 700 are similar to that of the amplifier 400. The major difference between the amplifiers 400 and 700 is the high-gain slice circuit design. The first amplifier circuit 701 and the second amplifier circuit 702 can be arranged in a symmetric configuration (the RF input of 702 and its signal path is not shown in the Figure for simplification). Hence, the same amplifier circuitry can be shared for performing the NCCA receiving operation indifferent bands. For example, the PCC slice circuit PCC_1 includes at least an input stage 700A, an output buffer 700B and a signal reconstruction circuit 700C, and the SCC slice circuit SCC_1 includes at least an input stage 710A, an output buffer 710B and a signal reconstruction circuit 710C.

In a case where an RF signal received from a desired NCCA band is fed into the first amplifier circuit 701 as illustrated in FIG. 7, the signal reconstruction circuit 700C can be used to reconstruct a second input signal S2 provided from the PCC slice circuit PCC_1 to the corresponding SCC slice circuit SCC_1 when the output buffer 700B should be turned off and the output buffer 710B should be turned on. Hence, in one high-gain PCC slice circuit (e.g. the PCC slice circuit PCC_1), if the output buffer 700B is turned off, the signal reconstruction circuit 700C of this PCC slice circuit will be turned on to avoid the situation that no inter-stage signal is available at a cascade node of the PCC slice circuit. In other words, the signal reconstruction circuit 700C can ensure that the second input signal S2 is delivered to a corresponding SCC slice circuit (e.g. SCC slice circuit SCC_1) from the PCC slice circuit (e.g. PCC slice PCC_1) when the output buffer 700B is off, to make the corresponding SCC slice circuit remain functional for generating an amplified output to the output port N2 of the second amplifier circuit 702.

The first amplifier circuit 701 and the second amplifier circuit 702 can be arranged in a symmetric configuration. In another case where an RF signal received from a desired NCCA band is fed into the second amplifier circuit 702, the signal reconstruction circuit 710C can be used to reconstruct an input signal provided from the SCC slice circuit SCC_1 to the corresponding PCC slice circuit PCC_1 when the output buffer 710B should be turned off and the output buffer 700B should be turned on. Hence, in one high-gain SCC slice circuit (e.g. SCC slice circuit SCC_1), if the output buffer 710B is turned off, the signal reconstruction circuit 710C of this SCC slice circuit will be turned on to avoid the situation that no inter-stage signal is available at a cascade node of the SCC slice circuit. In other words, the signal reconstruction circuit 710C can ensure an input signal is delivered to a corresponding PCC slice circuit (e.g. PCC slice circuit PCC_1) from the SCC slice circuit SCC_1 when the output buffer 710B is off, to make the corresponding PCC slice circuit remain functional for generating an amplified output to the output port N1 of the first amplifier circuit 701.

Figure 8:
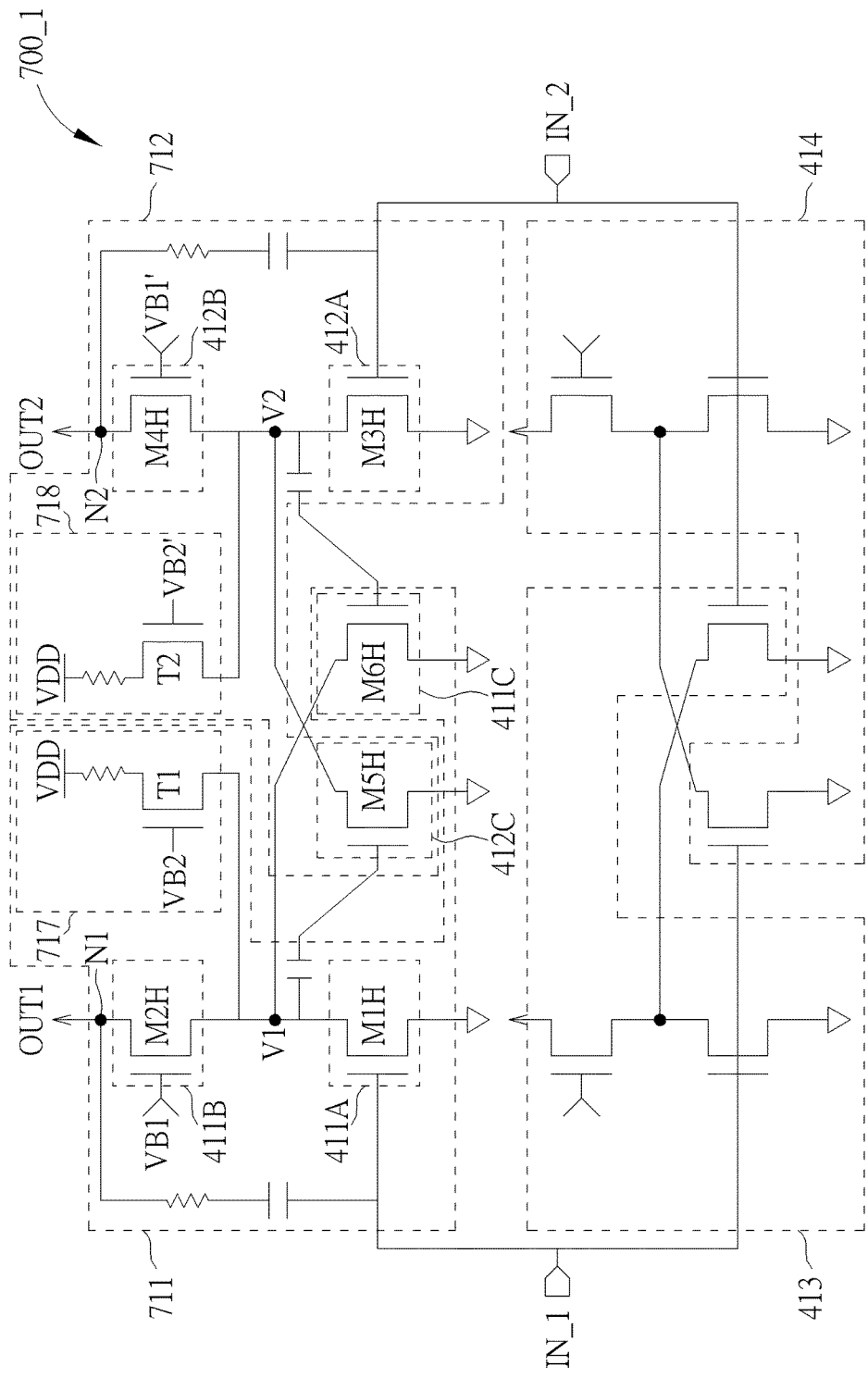
FIG. 8 is a diagram illustrating a partial circuit structure of the amplifier shown in FIG. 7 according to an embodiment of the present invention.

FIG. 8 is a diagram illustrating a partial circuit structure 700_1 of the amplifier 700 shown in FIG. 7 according to an embodiment of the present invention. The partial circuit structure 700_1 can be obtained by adding two signal reconstruction circuits 717 and 718 to the partial circuit structure 400_1 shown in FIG. 4. In this embodiment, only four slice circuits are shown in FIG. 8 for illustrative purposes. The partial circuit structure 700_1 includes two PCC slice circuits 711 and 413 and two SCC slice circuits 712 and 414. In this example, the PCC slice circuit 711 and the SCC slice circuit 712 may be high-gain slice circuits for the high-gain path/high-gain mode, and the PCC slice circuit 413 and the SCC slice circuit 414 may be low-gain slice circuits for the low-gain path/low-gain mode. The PCC slice circuit 711 includes the signal reconstruction circuit 717 and the aforementioned input stages 411A, 411C and output buffer 411B. The SCC slice circuit 712 includes the signal reconstruction circuit 718 and the aforementioned input stages 412A, 412C and output buffer 412B. If the PCC slice circuit PCC_1 in FIG. 7 is implemented using the PCC slice circuit 711 and the corresponding SCC slice circuit SCC_1 in FIG. 7 is implemented using the SCC slice circuit 712, the input stage 700A is implemented using the input stage 411A, the output buffer 700B is implemented using the output buffer 411B, the signal reconstruction circuit 700C is implemented using the signal reconstruction circuit 717, the input stage 710A is implemented using the input stage 412A, the output buffer 710B is implemented using the output buffer 412B, and the signal reconstruction circuit 710C is implemented using the signal reconstruction circuit 718.

In this embodiment, the signal reconstruction circuit 717 includes a transistor (e.g., NMOS transistor) T1, and the signal reconstruction circuit 718 includes a transistor (e.g., NMOS transistor) T2. With regard to the transistor T1, a control node (e.g., gate of NMOS transistor) is arranged to receive a second bias voltage VB2, a first connection node (e.g., drain of NMOS transistor) is coupled to another reference voltage (e.g., supply voltage VDD), and a second connection node (e.g., source of NMOS transistor) is connected to the first connection node of the transistor M1H. The second bias voltage VB2 is used to control whether the signal reconstruction circuit 717 is turned on to reconstruct an inter-stage signal V1 at a cascode node between the transistors M1H and M2H. With regard to the transistor T2, a control node (e.g., gate of NMOS transistor) is arranged to receive another second bias voltage VB2', a first connection node (e.g., drain of NMOS transistor) is coupled to another reference voltage (e.g., supply voltage VDD), and a second connection node (e.g., source of NMOS transistor) is connected to the first connection node of the transistor M3H. The second bias voltage VB2' is used to control whether the signal reconstruction circuit 718 is turned on to reconstruct an inter-stage signal V2 at a cascode node between the transistors M3H and M4H.

It should be noted that an inter-stage signal V1 is sensed/received by the input stage 412C to generate a signal V2 at the cascode node between the transistors M3H and M4H when the RF signal (e.g., IN_1) received from a desired NCCA band is fed into the first amplifier circuit 701, and an inter-stage signal V2 is sensed/received by the input stage 411C to generate a signal V1 at the cascade node between the transistors M1H and M2H when the RF signal (e.g., IN_2) received from a desired NCCA band is fed into the second amplifier circuit 702. For clarity and simplicity, the following assumes that the RF signal (e.g., IN_1) of a desired NCCA band is received from a first RX port and fed into the amplifier 700, while no RF signal (e.g., IN_2) is received from a second RX port.

The first gain of the first amplifier circuit 701 is controlled by the number of turned-on PCC slice circuits, and the second gain of the second amplifier circuit 702 is controlled by the number of turned-on SCC slice circuits. Considering the high-gain path in the NCCA scenario, if the first gain of the first amplifier circuit 701 used to generate the first output signal OUT1 for undergoing down-conversion of the PCC channel is required to be smaller than the second gain of the second amplifier circuit 702 used to generate the second output signal OUT2 for undergoing down-conversion of the SCC channel, the number of turned-on PCC slice circuits in the first amplifier circuit 701 is smaller than the number of turned-on SCC slice circuits in the second amplifier circuit 702. If the gain setting of the first amplifier circuit 701 requires the PCC slice circuit 711 shown in FIG. 8 to be turned off, and the gain setting of the second amplifier circuit 702 requires the SCC slice circuit 712 shown in FIG. 8 to be turned on, the first bias voltage VB1 is set by a low level, and another first bias voltage VB1' is set by a high level. Since the output buffer 411B is turned off due to the transistor M2H turned off by the first bias voltage VB1, the second bias voltage VB2 is set by a high level to turn on the transistor T1 for signal reconstruction. Since the signal reconstruction circuit 711 is turned on, a current path is established by the transistors M1H and T1, thereby creating the inter-stage signal V1 at the cascode node between the transistors M1H and T1. In other words, the signal reconstruction circuit 717 is turned on to reconstruct the inter-stage signal V1 that serves as a second input signal sensed/received by the transistor M5H of the input stage 412C. Though the output buffer 411B is turned off without generating an amplified output to the output node N1 of the first amplifier circuit 701, the signal V2 is generated at the cascode node between transistors M3H and M4H according to the inter-stage signal V1 reconstructed due to the signal reconstruction circuit 711. In this way, the output buffer 412B of the SCC slice circuit 712 successfully outputs an amplified output to the output node N2 of the second amplifier circuit 702 under a condition that the output buffer 411B of the PCC slice circuit 711 is turned off. It should be noted that the transistors T2, M3H and M6H are turned off in this case.

Figure 9:
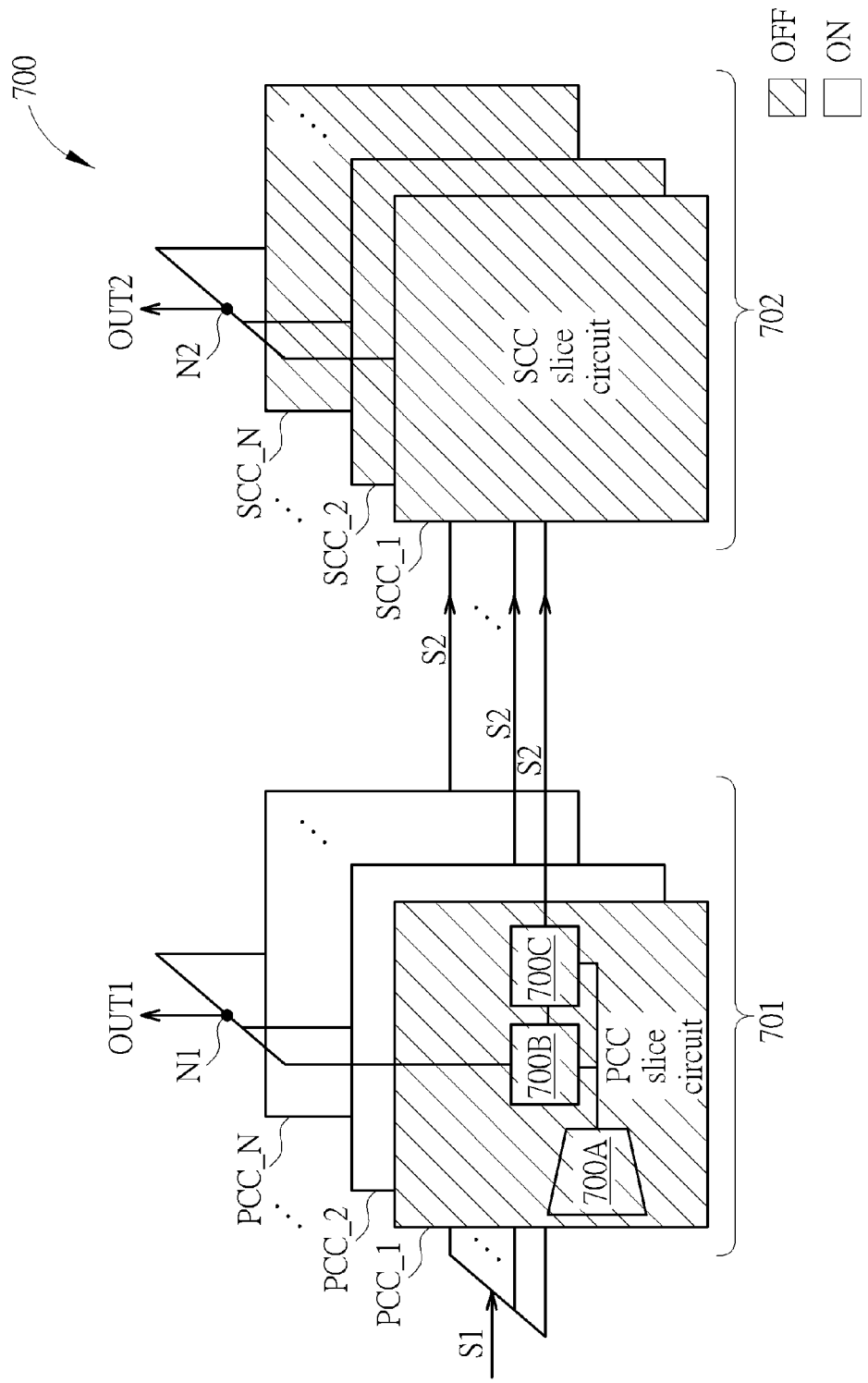
FIG. 9 is a diagram illustrating the amplifier shown in FIG. 7 that is operated in a first operating status according to an embodiment of the present invention.

The signal reconstruction circuit 700C will be turned on if necessary. For example, the output buffer 700B and the signal reconstruction circuit 700C are not turned on concurrently. In practice, on/off statuses of input stage, output buffer and signal reconstruction circuit in the proposed high-gain slice circuit depend on the operational status of the amplifier 700. For example, considering a case where the amplifier 700 is operated in a non-NCCA scenario, the input stage 700A, the output buffer 700B and the signal reconstruction circuit 700C of the PCC slice circuit PCC_1 are turned off if the gain setting of the first amplifier circuit 701 for the low-gain mode does not need the PCC slice circuit PCC_1 to be turned on, as illustrated in FIG. 9.

Figure 10:
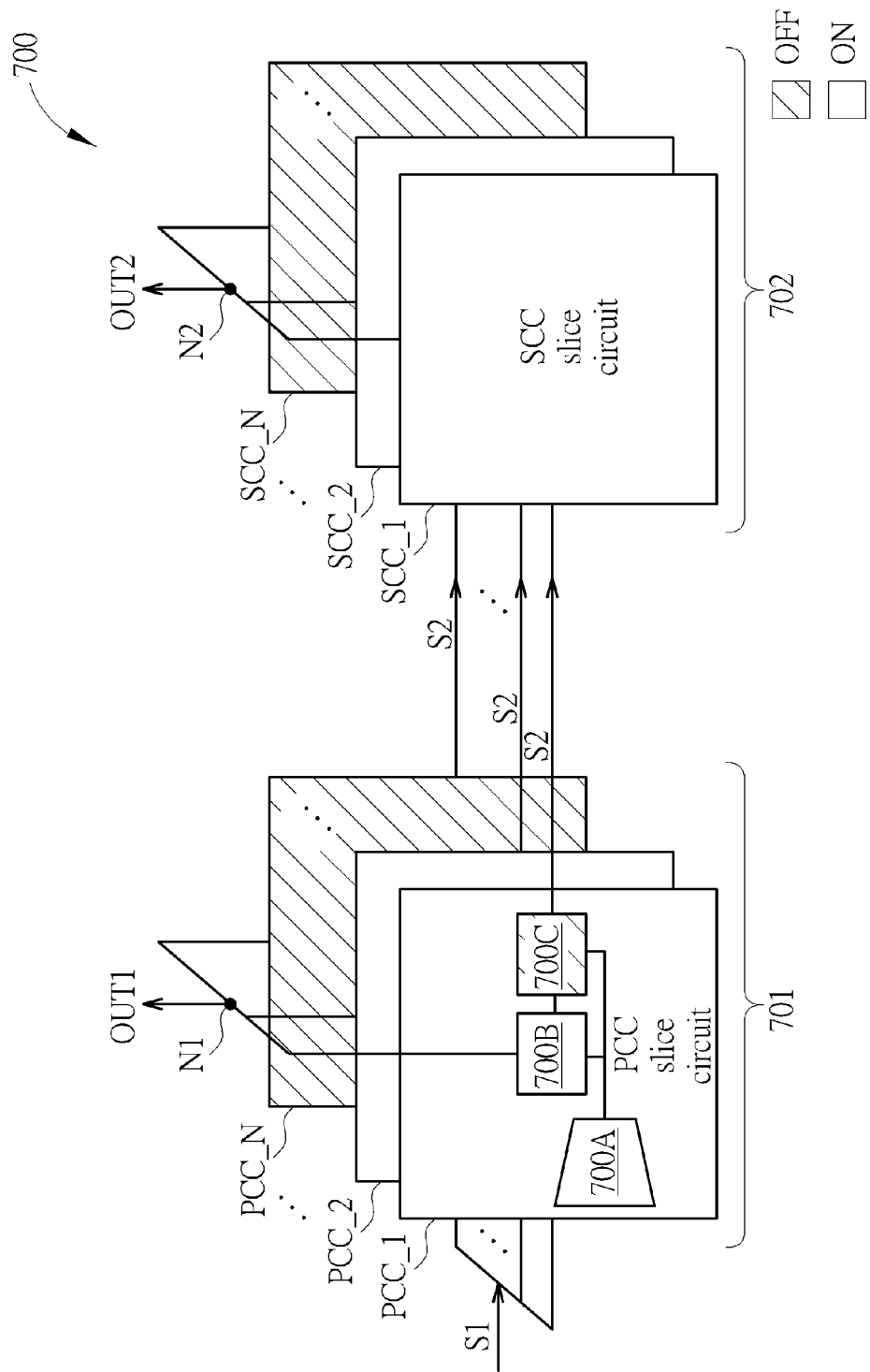
FIG. 10 is a diagram illustrating the amplifier shown in FIG. 7 that is operated in a second operating status according to an embodiment of the present invention.

For another example, considering a case where the amplifier 700 is operated in an NCCA scenario for processing PCC channel and SCC channel in the same band, the input stage 700A and the output buffer 700B of the PCC slice circuit PCC_1 are turned on and the signal reconstruction circuit 700C of the PCC slice circuit PCC_1 is turned off if the first gain of the first amplifier circuit 701 is equal to the second gain of the second amplifier circuit 702, as illustrated in FIG. 10.

Figure 11:
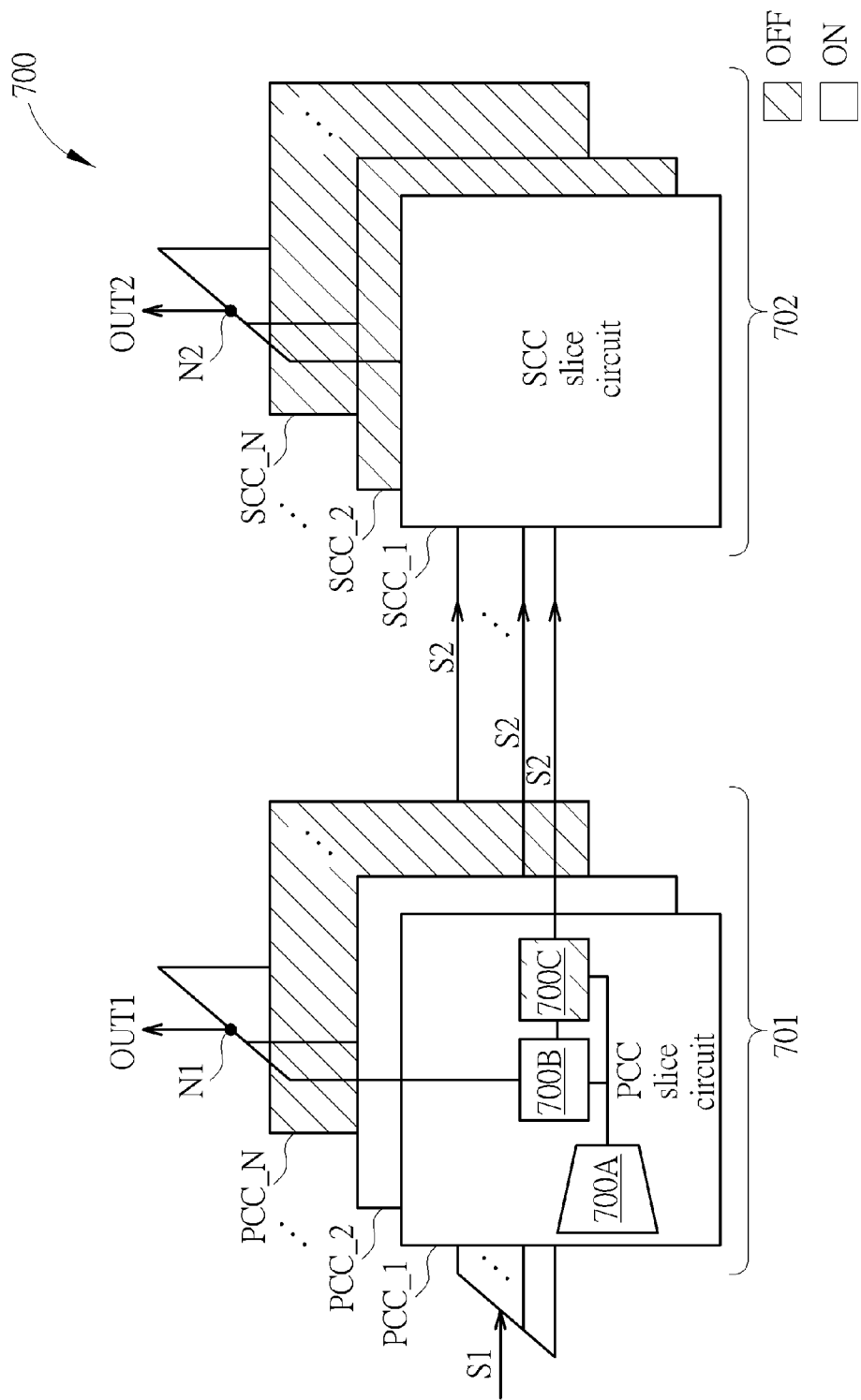
FIG. 11 is a diagram illustrating the amplifier shown in FIG. 7 that is operated in a third operating status according to an embodiment of the present invention.

For another example, considering a case where the amplifier 700 is operated in an NCCA scenario for processing PCC channel and SCC channel in the same band, the input stage 700A and the output buffer 700B of the PCC slice circuit PCC_1 are turned on and the signal reconstruction circuit 700C of the PCC slice circuit PCC_1 is turned off if the first gain of the first amplifier circuit 701 is larger than the second gain of the second amplifier circuit 702, as illustrated in FIG. 11.

Figure 12:
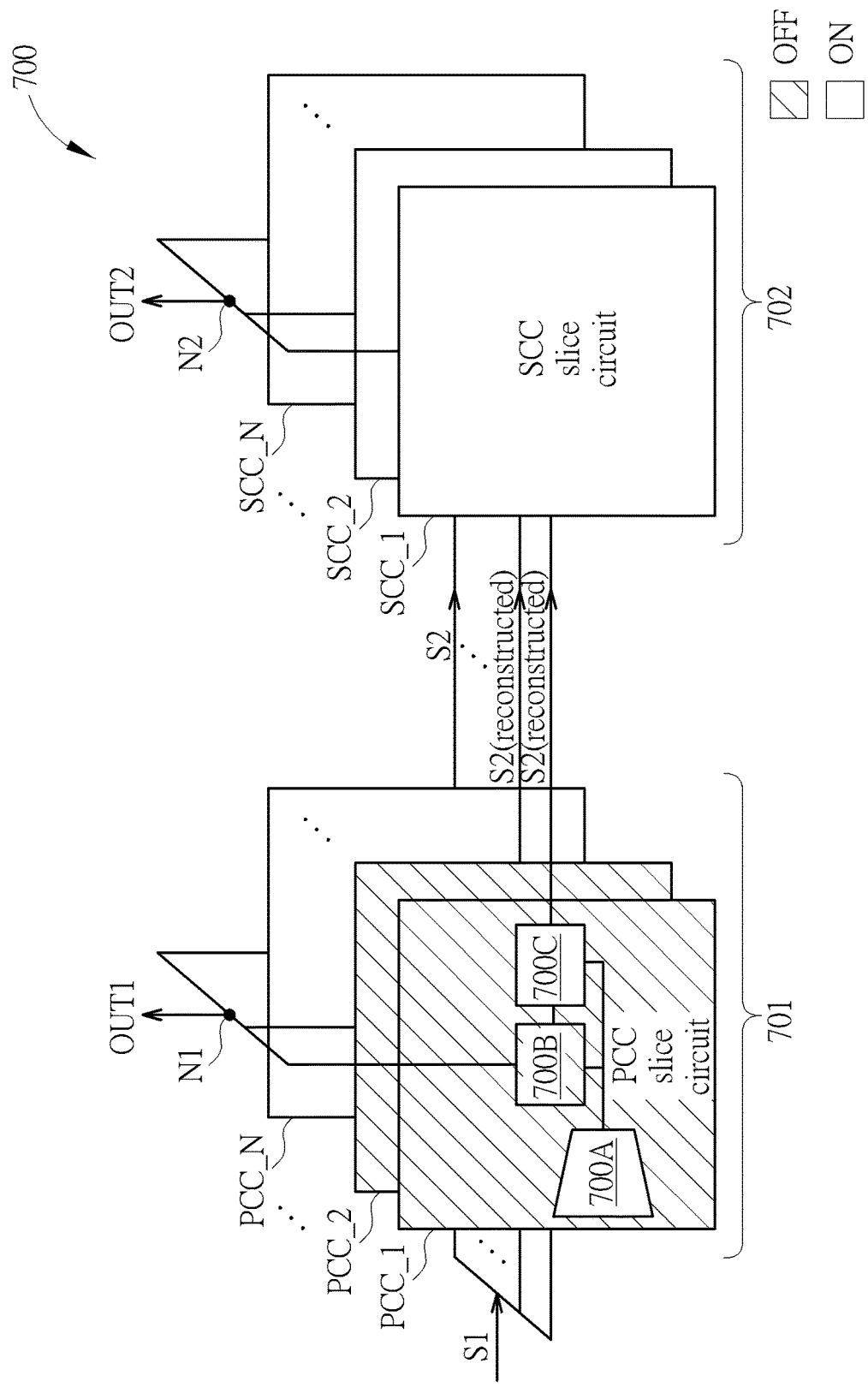
FIG. 12 is a diagram illustrating the amplifier shown in FIG. 7 that is operated in a fourth operating status according to an embodiment of the present invention.

For another example, considering a case where the amplifier 700 is operated in an NCCA scenario for processing PCC channel and SCC channel in the same band, the output buffer 700B of the PCC slice circuit PCC_1 is turned off and the input stage 700A and the signal reconstruction circuit 700C of the PCC slice circuit PCC_1 are turned on if the first gain of the first amplifier circuit 701 is smaller than the second gain of the second amplifier circuit 702, as illustrated in FIG. 12.

In above embodiments, the first amplifier circuit 401/701 and the second amplifier circuit 402/702 can be arranged in a symmetric configuration to support NCCA receiving operation in different bands. However, this is for illustrative purposes only, and is not meant to be a limitation of the present invention. In an alternative design of the partial circuit structure 400_1 shown in FIG. 5, the second amplifier circuit 402 is not used to receive an RF signal (e.g., IN_2) of a different NCCA band from another RX port, and the transistors M3H and M6H may be omitted from the SCC slice circuit 412. In an alternative design of the partial circuit structure 700_1 shown in FIG. 8, the second amplifier circuit 702 is not used to receive an RF signal (e.g., IN_2) of a different NCCA band from another RX port, and the transistors M3H, M6H and T2 may be omitted from the SCC slice circuit 712. These also fall within the scope of the present invention.

In above embodiments, the first amplifier circuit 401/701 is composed of PCC slice circuits used to generate the first output signal OUT1 for undergoing down-conversion of PCC channel, and the second amplifier circuit 402/702 is composed of SCC slice circuits used to generate the second output signal OUT2 for undergoing down-conversion of SCC channel, where the gain setting of the first amplifier circuit 401/701 and the gain setting of the second amplifier circuit 402/702 can be adjusted independently. It should be noted that each of the first output signal OUT1 and the second output signal OUT2 has PCC channel data and SCC channel data, and the first output signal OUT1 and the second output signal OUT2 are generated under the same amplifier gain setting or different amplifier gain settings, depending upon actual signal reception condition. Hence, in an alternative design, the first amplifier circuit 401/701 may be configured to include slice circuits (i.e., SCC slice circuits) used to generate the first output signal OUT1 for undergoing down-conversion of SCC channel, and the second amplifier circuit 402/702 may be configured to include slice circuits (i.e., PCC slice circuits) used to generate the second output signal OUT2 for undergoing down-conversion of PCC channel. This also falls within the scope of the present invention.

To summarize, according to the embodiments of the present invention, one multi-output LNA architecture is provided to support the in-band non-contiguous carrier aggregation reception, wherein the gains of different amplifier circuits (e.g., PCC LNA circuit and SCC LNA circuit) can be adjusted independently, and an input signal of a second amplifier circuit (which is configured to generate an output signal for undergoing down-conversion of one of PCC channel and SCC channel) is provided by a first amplifier circuit (which is configured to generate an output signal for undergoing down-conversion of the other of PCC channel and SCC channel) according to an RF input received from a desired NCCA band. Further, a signal reconstruction circuit is provided to selectively reconstruct an inter-stage signal in the first amplifier circuit. For example, when an output buffer in the first amplifier is turned off under a condition that a first gain of the first amplifier circuit is smaller than a second gain of the second amplifier circuit, the signal reconstruction circuit in the first amplifier circuit can be turned on to reconstruct the inter-stage signal that serves as an input signal of the amplifier circuit. Hence, the inter-stage signal reconstructed by the signal reconstruction circuit is sensed/received by the second amplifier circuit that has an output buffer turned on for generating an amplified output.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An amplifier applicable to an intra-band non-contiguous carrier aggregation (NCCA) band, the NCCA band including at least a primary component carrier (PCC) channel and a secondary component carrier (SCC) channel not adjacent to each other, the amplifier comprising:
   a first amplifier circuit, arranged to receive a first input signal and generate a first output signal for undergoing down-conversion of one of the PCC channel and the SCC channel; and
   a second amplifier circuit, arranged to receive at least one second input signal and generate a second output signal for undergoing down-conversion of another of the PCC channel and the SCC channel;
   wherein the at least one second input signal received by the second amplifier circuit is provided by the first amplifier circuit according to the first input signal, and comprises a derivative of the first input signal.

2. The amplifier of claim 1, wherein the first amplifier circuit comprises:
   a first slice circuit, comprising:

an input stage, arranged to receive the first input signal; and an output buffer, coupled to the input stage and arranged to output a first amplified output to an output port of the first amplifier circuit, wherein the first amplified output is at least a portion of the first output signal generated at the output port of the first amplifier circuit when being output from the first slice circuit.

3. The amplifier of claim 2, wherein the first slice circuit further comprises:

a signal reconstruction circuit, coupled to the input stage and arranged to selectively reconstruct the second input signal provided to the second slice circuit.

4. The amplifier of claim 3, wherein the output buffer and the signal reconstruction circuit are not turned on concurrently.

5. The amplifier of claim 3, wherein:

the input stage comprises:
a first transistor, having a control node arranged to receive the first input signal, a first connection node, and a second connection node coupled to a first reference voltage, wherein the at least one second input signal is sensed from the first connection node of the first transistor;

the output buffer comprises:
a second transistor, having a control node arranged to receive a first bias voltage, a first connection node coupled to the output port of the first amplifier circuit, and a second connection node coupled to the first connection node of the first transistor; and the signal reconstruction circuit comprises:
a third transistor, having a control node arranged to receive a second bias voltage, a first connection node coupled to a second reference voltage, and a second connection node coupled to the first connection node of the first transistor.

6. The amplifier of claim 3, wherein the second amplifier circuit comprises:

a second slice circuit, arranged to receive a second input signal from the first slice circuit, and output a second amplified signal to an output port of the second amplifier circuit, wherein the second amplified signal is at least a portion of the second output signal generated at the output port of the second amplifier circuit when being output from the second slice circuit.

7. The amplifier of claim 6, wherein the first amplifier circuit comprises a plurality of first slice circuits, including the first slice circuit; the second amplifier circuit comprises a plurality of second slice circuits, including the second slice circuit; the first amplifier circuit is arranged to generate the first output signal according to a first gain; the second amplifier circuit is arranged to generate the second output signal according to a second gain; the first gain is adjusted according to a number of turned-on first slice circuits of the first amplifier circuit; and the second gain is adjusted according to a number of turned-on second slice circuits of the second amplifier circuit.

8. The amplifier of claim 7, wherein the first gain and the second gain are adjusted independently.

9. The amplifier of claim 7, wherein when the first gain is smaller than the second gain, the output buffer is turned off, and the signal reconstruction circuit is turned on to reconstruct the second input signal.

10. The amplifier of claim 7, wherein when the first gain is not smaller than the second gain, the output buffer is turned on to enable generation of the second input signal, and the signal reconstruction circuit is turned off.

11. An amplifier applicable to an intra-band non-contiguous carrier aggregation (NCCA) band, the NCCA band including at least a primary component carrier (PCC) channel and a secondary component carrier (SCC) channel not adjacent to each other, the amplifier comprising:

a first amplifier circuit, arranged to receive a first input signal and generate a first output signal for undergoing down-conversion of one of the PCC channel and the SCC channel, wherein the first amplifier circuit comprises:

a first slice circuit, comprising:
an input stage, arranged to receive the first input signal; and
an output buffer, coupled to the input stage and arranged to output a first amplified output to an output port of the first amplifier circuit, wherein the first amplified output is at least a portion of the first output signal generated at the output port of the first amplifier circuit when being output from the first slice circuit; and a second amplifier circuit, arranged to receive at least one second input signal and generate a second output signal for undergoing down-conversion of another of the PCC channel and the SCC channel;

wherein the at least one second input signal received by the second amplifier circuit is provided by the first amplifier circuit according to the first input signal.

12. The amplifier of claim 11, wherein the first slice circuit further comprises:

a signal reconstruction circuit, coupled to the input stage and arranged to selectively reconstruct the second input signal provided to the second amplifier circuit.

13. The amplifier of claim 12, wherein the output buffer and the signal reconstruction circuit are not turned on concurrently.

14. The amplifier of claim 12, wherein:

the input stage comprises:
a first transistor, having a control node arranged to receive the first input signal, a first connection node, and a second connection node coupled to a first reference voltage, wherein the at least one second input signal is sensed from the first connection node of the first transistor;

the output buffer comprises:
a second transistor, having a control node arranged to receive a first bias voltage, a first connection node coupled to the output port of the first amplifier circuit, and a second connection node coupled to the first connection node of the first transistor; and the signal reconstruction circuit comprises:
a third transistor, having a control node arranged to receive a second bias voltage, a first connection node coupled to a second reference voltage, and a second connection node coupled to the first connection node of the first transistor.

15. The amplifier of claim 12, wherein the second amplifier circuit comprises:

a second slice circuit, arranged to receive a second input signal from the first slice circuit, and output a second amplified signal to an output port of the second amplifier circuit, wherein the second amplified signal is at least a portion of the second output signal generated at the output port of the second amplifier circuit when being output from the second slice circuit.

16. The amplifier of claim 15, wherein the first amplifier circuit comprises a plurality of first slice circuits, including the first slice circuit; the second amplifier circuit comprises a plurality of second slice circuits, including the second slice circuit; the first amplifier circuit is arranged to generate the first output signal according to a first gain; the second amplifier circuit is arranged to generate the second output signal according to a second gain; the first gain is adjusted according to a number of turned-on first slice circuits of the first amplifier circuit; and the second gain is adjusted according to a number of turned-on second slice circuits of the second amplifier circuit.

17. The amplifier of claim 16, wherein the first gain and the second gain are adjusted independently.

18. The amplifier of claim 16, wherein when the first gain is smaller than the second gain, the output buffer is turned off, and the signal reconstruction circuit is turned on to reconstruct the second input signal.

19. The amplifier of claim 16, wherein when the first gain is not smaller than the second gain, the output buffer is turned on to enable generation of the second input signal, and the signal reconstruction circuit is turned off.

20. A method for operating an amplifier applicable to an intra-band non-contiguous carrier aggregation (NCCA) band, the NCCA band including at least a primary component carrier (PCC) channel and a secondary component carrier (SCC) channel not adjacent to each other, the method comprising:
  utilizing a first amplifier circuit to receive a first input signal and generate a first output signal for undergoing down-conversion of one of the PCC channel and the SCC channel;
  providing at least one second input signal to a second amplifier circuit; and
  utilizing the second amplifier circuit to receive the at least one second input signal and to generate a second output signal for undergoing down-conversion of another of the PCC channel and the SCC channel;
  wherein the at least one second input signal received by the second amplifier circuit is provided by the first amplifier circuit according to the first input signal, and comprises a derivative of the first input signal.

21. The method of claim 20, wherein utilizing the first amplifier circuit comprises:
  utilizing a first slice circuit, comprising:
    utilizing an input stage to receive the first input signal; and
    utilizing an output buffer, coupled to the input stage, to output a first amplified output to an output port of the first amplifier circuit,
      wherein the first amplified output is at least a portion of the first output signal generated at the output port of the first amplifier circuit when being output from the first slice circuit.

22. The method of claim 21, wherein utilizing the first slice circuit further comprises:
  utilizing a signal reconstruction circuit, coupled to the input stage, to selectively reconstruct the second input signal provided to the second slice circuit.

23. The method of claim 22, wherein the output buffer and the signal reconstruction circuit are not turned on concurrently.

24. The method of claim 22, wherein:
  the input stage comprises:
    a first transistor, having a control node arranged to receive the first input signal, a first connection node, and a second connection node coupled to a first reference voltage, wherein the at least one second input signal is sensed from the first connection node of the first transistor;
  the output buffer comprises:
    a second transistor, having a control node arranged to receive a first bias voltage, a first connection node coupled to the output port of the first amplifier circuit, and a second connection node coupled to the first connection node of the first transistor; and
  the signal reconstruction circuit comprises:
    a third transistor, having a control node arranged to receive a second bias voltage, a first connection node coupled to a second reference voltage, and a second connection node coupled to the first connection node of the first transistor.

25. The method of claim 22, wherein utilizing the second amplifier circuit comprises:
  utilizing a second slice circuit to receive a second input signal from the first slice circuit and to output a second amplified signal to an output port of the second amplifier circuit, wherein the second amplified signal is at least a portion of the second output signal generated at the output port of the second amplifier circuit when being output from the second slice circuit.

26. The method of claim 25, wherein the first amplifier circuit comprises a plurality of first slice circuits, including the first slice circuit; the second amplifier circuit comprises a plurality of second slice circuits, including the second slice circuit; the first amplifier circuit is arranged to generate the first output signal according to a first gain; the second amplifier circuit is arranged to generate the second output signal according to a second gain; and the method further comprises:
  adjusting the first gain according to a number of turned-on first slice circuits of the first amplifier circuit; and
  adjusting the second gain according to a number of turned-on second slice circuits of the second amplifier circuit.

27. The method of claim 26, wherein the first gain and the second gain are adjusted independently.

28. The method of claim 26, further comprising:
  when the first gain is smaller than the second gain, turning off the output buffer, and turning on the signal reconstruction circuit to reconstruct the second input signal.

29. The method of claim 26, further comprising:
  when the first gain is not smaller than the second gain, turning on the output buffer to enable generation of the second input signal, and turning off the signal reconstruction circuit.

30. A method for operating an amplifier applicable to an intra-band non-contiguous carrier aggregation (NCCA) band, the NCCA band including at least a primary component carrier (PCC) channel and a secondary component carrier (SCC) channel not adjacent to each other, the method comprising:
  utilizing a first amplifier circuit to receive a first input signal and generate a first output signal for undergoing down-conversion of one of the PCC channel and the SCC channel, wherein utilizing the first amplifier circuit comprises:
    utilizing a first slice circuit, comprising:
      utilizing an input stage to receive the first input signal; and
      utilizing an output buffer, coupled to the input stage, to output a first amplified output to an output port of the first amplifier circuit, wherein the first amplified output is at least a portion of the first output signal generated at the output port of the first amplifier circuit when being output from the first slice circuit;

providing at least one second input signal to a second amplifier circuit; and utilizing the second amplifier circuit to receive the at least one second input signal and to generate a second output signal for undergoing down-conversion of another of the PCC channel and the SCC channel;

wherein the at least one second input signal received by the second amplifier circuit is provided by the first amplifier circuit according to the first input signal.

31. The method of claim 30, wherein utilizing the first slice circuit further comprises:

utilizing a signal reconstruction circuit, coupled to the input stage, to selectively reconstruct the second input signal provided to the second amplifier circuit.

32. The method of claim 31, wherein the output buffer and the signal reconstruction circuit are not turned on concurrently.

33. The method of claim 31, wherein:

the input stage comprises:

a first transistor, having a control node arranged to receive the first input signal, a first connection node, and a second connection node coupled to a first reference voltage, wherein the at least one second input signal is sensed from the first connection node of the first transistor;

the output buffer comprises:

a second transistor, having a control node arranged to receive a first bias voltage, a first connection node coupled to the output port of the first amplifier circuit, and a second connection node coupled to the first connection node of the first transistor; and the signal reconstruction circuit comprises:

a third transistor, having a control node arranged to receive a second bias voltage, a first connection node coupled to a second reference voltage, and a second connection node coupled to the first connection node of the first transistor.

34. The method of claim 31, wherein utilizing the second amplifier circuit comprises:

utilizing a second slice circuit to receive a second input signal from the first slice circuit and to output a second amplified signal to an output port of the second amplifier circuit, wherein the second amplified signal is at least a portion of the second output signal generated at the output port of the second amplifier circuit when being output from the second slice circuit.

35. The method of claim 34, wherein the first amplifier circuit comprises a plurality of first slice circuits, including the first slice circuit; the second amplifier circuit comprises a plurality of second slice circuits, including the second slice circuit; the first amplifier circuit is arranged to generate the first output signal according to a first gain; the second amplifier circuit is arranged to generate the second output signal according to a second gain; and the method further comprises:

adjusting the first gain according to a number of turned-on first slice circuits of the first amplifier circuit; and adjusting the second gain according to a number of turned-on second slice circuits of the second amplifier circuit.

36. The method of claim 35, wherein the first gain and the second gain are adjusted independently.

37. The method of claim 35, further comprising:

when the first gain is smaller than the second gain, turning off the output buffer, and turning on the signal reconstruction circuit to reconstruct the second input signal.

38. The method of claim 35, further comprising:

when the first gain is not smaller than the second gain, turning on the output buffer to enable generation of the second input signal, and turning off the signal reconstruction circuit.

* * * * *